United States Patent
Vaarlid (10) Patent No.: US 11,397,702 B2
(45) Date of Patent: Jul. 26, 2022

(54) INTERFACING A NUMBER OF SERIAL COMMUNICATION INTERFACES WITH A PARALLEL COMMUNICATION INTERFACE, AND RELATED SYSTEMS, METHODS, AND APPARATUSES

(71) Applicant: Microchip Technology Incorporated, Chandler, AZ (US)

(72) Inventor: Johan Vaarlid, Trondelag (NO)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/171,697

(22) Filed: Feb. 9, 2021

(65) Prior Publication Data

US 2021/0271627 A1    Sep. 2, 2021

Related U.S. Application Data (60) Provisional application No. 62/984,086, filed on Mar. 2, 2020.

(51) Int. Cl.
    *G06F 13/42*  (2006.01)
    *G06F 1/12*   (2006.01)
    *G06F 13/38*  (2006.01)

(52) U.S. Cl.
    CPC ............ *G06F 13/4291* (2013.01); *G06F 1/12* (2013.01); *G06F 13/382* (2013.01)

(58) Field of Classification Search
    CPC ....... G06F 13/382; G06F 13/4291; G06F 1/12
    See application file for complete search history.

(56) References Cited

U.S. PATENT DOCUMENTS

| | | | |
|---|---|---|---|
| 4,924,464 A | 5/1990 | Baylock | |
| 6,684,275 B1 | 1/2004 | Goldstein | |
| 2003/0002474 A1 | 1/2003 | Alexander et al. | |
| 2004/0221201 A1* | 11/2004 | Seroff | G06F 11/3636 714/30 |
| 2011/0196997 A1* | 8/2011 | Ruberg | H04L 29/10 710/71 |

OTHER PUBLICATIONS

International Search Report from International Application No. PCT/US2021/017246, dated May 25, 2021, 6 pages.
International Written Opinion from International Application No. PCT/US2021/017246, dated May 25, 2021, 11 pages.

\* cited by examiner

*Primary Examiner* — Zachary K Huson
(74) *Attorney, Agent, or Firm* — TraskBritt (57) ABSTRACT

Disclosed embodiments relate, generally, to interfacing serial communication interfaces of a first device with a parallel communication interface of a second device. A first group of two or more serial communication interfaces and an interfacing logic may be provided. The interfacing logic may form second encoded data blocks by arranging the data elements of the first encoded data blocks such that data elements within a same data element position of respective second encoded data blocks represent a given one of the symbols, and provide the second encoded data blocks to a number of serial communication interfaces coupled to a parallel communication interface of another device. An interfacing logic may additionally or alternatively be configured to receive, from a second group of two or more serial communication interfaces, received encoded data blocks representing received symbols.

18 Claims, 6 Drawing Sheets

INTERFACING A NUMBER OF SERIAL COMMUNICATION INTERFACES WITH A PARALLEL COMMUNICATION INTERFACE, AND RELATED SYSTEMS, METHODS, AND APPARATUSES

CROSS-REFERENCE TO RELATED APPLICATIONS

This application claims the benefit of the priority date of U.S. Provisional Patent Application No. 62/984,086, filed Mar. 2, 2020, and titled "INTERFACING A NUMBER OF SERIAL COMMUNICATION INTERFACES WITH A PARALLEL COMMUNICATION INTERFACE, AND RELATED SYSTEMS, METHODS, AND APPARATUSES," the disclosure and contents of which is incorporated herein in its entirety by this reference.

FIELD

This description relates, generally, to data communication, and more specifically, some embodiments relate to methods of interfacing serial communication interfaces to a parallel communication interface and communication using the same.

BACKGROUND

Microcontrollers and embedded systems more generally sometimes include one or more serial communication devices, such as universal synchronous/asynchronous receivers and transmitters (USART), without limitation, for forming serial communication links, and serial communication more generally, over various buses. Serial communication is generally understood by the inventor of this disclosure to be good for long-distance data transfer and for cases where an amount of data (typically measured in bits, bytes, or nibbles), is relatively small.

Parallel communication is generally understood by the inventor of this disclosure to be a disfavored form of communication by microcontrollers, as a non-limiting example, because it ties up pins (e.g., input/output (I/O) pins, without limitation) and over long distances parallel communication is susceptible to noise and susceptible to transmission errors due to timing errors. The inventor of this disclosure appreciates that some microcontroller designers may forgo support for parallel communication, and microcontroller peripherals that support parallel communication are relatively uncommon.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

In the following detailed description, reference is made to the accompanying drawings, which form a part hereof, and in which are shown, by way of illustration, specific example embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

It will be readily understood that the components of the embodiments as generally described herein and illustrated in the drawings may be arranged and designed in a wide variety of different configurations. Thus, the following description of various embodiments is not intended to limit the scope of the present disclosure, but is merely representative of various embodiments. While the various aspects of the embodiments may be presented in drawings, the drawings are not necessarily drawn to scale unless specifically indicated.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

Thus, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Information and signals described herein may be represented using any of a variety of different technologies and techniques. For example, data, instructions, commands, information, signals, bits, and symbols that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the disclosure may be implemented on any number of data signals including a single data signal.

It should be understood that any reference to an element herein using a designation such as "first," "second," and so forth does not limit the quantity or order of those elements, unless such limitation is explicitly stated. Rather, these designations are used herein as a convenient method of distinguishing between two or more elements or instances of an element. Thus, a reference to first and second elements does not mean that only two elements can be employed or that the first element must precede the second element in some manner. Also, unless stated otherwise a set of elements may comprise one or more elements. Likewise, sometimes elements referred to in the singular form may also include one or more instances of the element.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

The various illustrative logical blocks, modules, and circuits described in connection with the embodiments disclosed herein may be implemented or performed with a general purpose processor, a special purpose processor, a Digital Signal Processor (DSP), an Application Specific Integrated Circuit (ASIC), a Field-Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

Also, it is noted that the embodiments may be described in terms of a process that is depicted as a flowchart, a flow diagram, a structure diagram, or a block diagram. Although a flowchart may describe operational acts as a sequential process, many of these acts may be performed in another sequence, in parallel, or substantially concurrently. In addition, the order of the acts may be re-arranged. A process may correspond to a method, a thread, a function, a procedure, a subroutine, and/or a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning unless expressly indicated otherwise or the context would indicate otherwise to a person having ordinary skill in the art.

As used herein, "symbol" means information represented by a number of data elements. In a communication system, any number of data elements may be pre-specified to represent symbols, though a sender and recipient may have an understanding about the number of data elements that constitute a symbol. Non-limiting examples of types of symbols include application information, control information, and timing information.

As used herein, "communicating" means sending and/or receiving a symbol, and "communication" means a process of communicating a symbol.

As used herein, "serial communication" means a process of communicating a symbol one data element at a time, in a sequence. Parallel communication means a process of communicating a symbol two or more data elements at a time, substantially simultaneously.

The inventor of this disclosure appreciates that support for parallel communication at computing systems that otherwise include peripherals configured for serial communication may be desirable.

One or more embodiments relate, generally, to interfacing serial communication interfaces (SCIs) of a first device with a parallel communication interface of a second device (also referred to herein as "another device"), a parallel communication interface (PCI) for forming a parallel communication link using serial communication interfaces (SCIs), and related systems, methods and devices. Interfacing logic of such a PCI block (e.g., implemented by logic circuitry of a processing core or central processing unit, without limitation) may be configured to: obtain symbols represented by first encoded data blocks each having a number N data elements arranged in a first order to represent a given symbol; logically group a number N of SCIs that share a clock; prepare the first data blocks for sending by rearranging the data elements of the first data blocks so that for resultant second encoded data blocks the data elements within a same data element position of a respective second encoded data blocks represent a given one of the symbols; send the second encoded data blocks to respective logically grouped SCIs (also referred to herein as a "serial interface group"); couple the respective logically grouped SCIs to transmission lines; and clock out the data elements at respective logically grouped SCIs synchronously to the transmission lines and thus to the parallel interface of the other device. While specific numbers of data elements or SCIs may be discussed or illustrated herein, it should be appreciated that the number N represents an arbitrary number, that is an arbitrary number of data elements used to represent a symbol or number of SCIs used to send data, and does not limit this disclosure to a specific number of data elements or SCIs.

Optionally, the interfacing logic of a parallel communication interface of the first device may initialize parameters for a parallel communication link with the second device according to whatever parallel communication protocol the first and second device are using. So, some symbols sent by the first device to the second device may be protocol symbols for initializing and training a stable parallel communication link between the first device and the second device. In various embodiments, some or a totality of such protocol symbols may be pre-specified (e.g., pre-arranged or otherwise pre-configured, without limitation) and stored at a parallel communication interface of the first device, such protocol symbols already arranged as second encoded data blocks suitable for transmission by a serial interface group or re-arranged as second encoded data block suitable for transmission by a serial interface group by interfacing logic as discussed herein.

Figure 1:
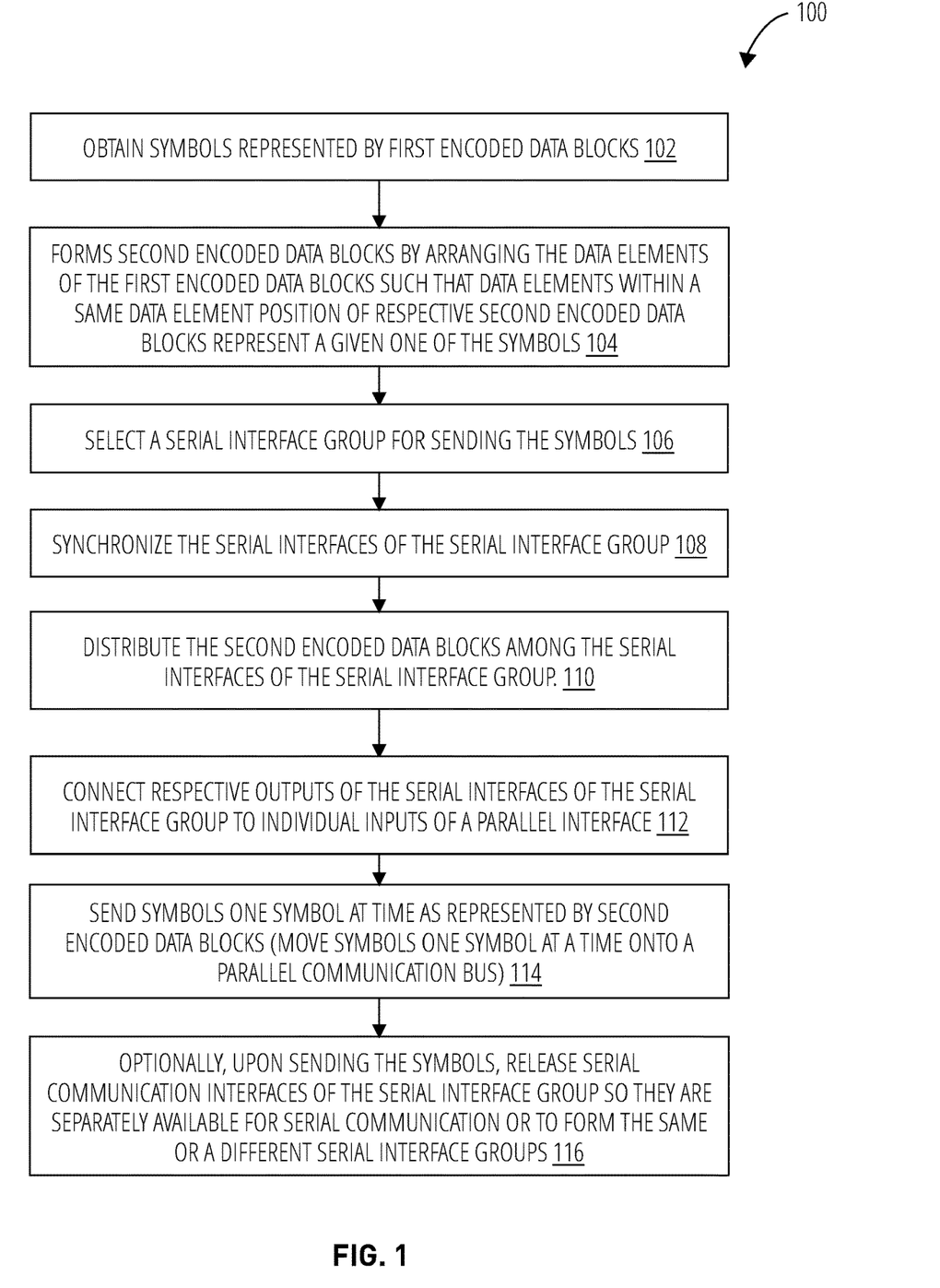
FIG. 1 is a flow chart depicting a process for interfacing a number of serial communication interfaces of a first device with a parallel communication interface of a second device, in accordance with one or more embodiments.

FIG. 1 is a flowchart depicting a process 100 for interfacing a number of serial communication interfaces of a first device with a parallel communication interface of a second device, in accordance with one or more embodiments.

At operation 102, process 100 obtains symbols represented by first encoded data blocks, each of which may comprise data elements. As non-limiting examples, the first encoded data blocks may be obtained at, or from, inputs, or a data register, arranged in accordance with a parallel communication interface, such as a PCI 502 of FIG. 5, without limitation.

At operation 104, process 100 forms second encoded data blocks by arranging the data elements of the first encoded data blocks such that data elements within a same data element position of respective second encoded data blocks represent a given one of the symbols. So, the data elements of a given one of the second encoded data blocks may include the data elements within a same element position of the various first encoded data blocks.

At operation 106, process 100 selects a serial interface group (i.e., logically groups a number of individual SCIs) for sending the symbols (e.g., communicating the symbols by transmitting the second encoded data blocks representing the symbols, without limitation). The number of selected SCIs may depend on a width of a parallel communication link between devices, and more generally a width of the parallel communication interface of the second device. Generally, a selected serial interface group will include at least two serial communication interfaces such that at least two data elements of second encoded data blocks may be sent over respective communication links simultaneously, i.e., in a manner consistent with parallel communication. The available width of a parallel communication link may be pre-specified, as a non-limiting example, pre-specified at system design according to a form of parallel communication protocol that will be used to form the parallel communication link. So, selection of more than two serial communication interfaces for a serial interface group is specifically contemplated and does not exceed the scope of this disclosure.

At operation 108, process 100 synchronizes the serial interfaces of the serial interface group. In some embodiments, serial communication interfaces may be automatically transmitting (i.e., configured to automatically transmit data in respective transmit registers, without limitation) and in such cases the serial communication interfaces may be synchronized by disabling automatic transmission, and one of the serial communication interfaces may be chosen to provide a clock as a "latch signal" (which in digital communication systems may take the form of a "latch symbol"), or a shared clock may be provided to the respective clock inputs of the serial communication interfaces. Such a latch signal may be delayed by half-a-clock cycle to latch transmitted data substantially at a correct signal level. In embodiments without automatically transmitting SCIs, the SCIs of a selected serial interface group are synchronized by providing a shared clock signal to the respective clock inputs of the SCIs.

At operation 110, process 100 distributes the second encoded data blocks among the selected serial interfaces of the serial interface group. As a non-limiting example, serial interface 0 may receive block 0 of the second encoded data blocks that includes respective data elements of data element positions 0 of the first encoded data blocks, serial interface 1 may receive block 1 of the second encoded data blocks that includes data elements of data element positions 1 of each of the first encoded data blocks, and so on.

At operation 112, process 100 connects (i.e., operatively couples) outputs of respective SCIs of the serial interface group to individual transmission lines and to individual respective inputs of the parallel interface of the second device. Unused transmission lines of an SCI may be uncoupled from the parallel interface, as a non-limiting example, in cases where a single clock is sent with the data, other clocks provided at the SCIs may be uncoupled.

At operation 114, process 100 sends (e.g., synchronously clocks out, without limitation) symbols, one symbol at time, as represented by second encoded data blocks. As a non-limiting example, each second encoded data block of the second encoded data blocks may be stored at a shift register used as a transmit register of a respective serial communication interface, and the encoded data elements for a given symbol may be moved, one symbol at a time, onto the parallel communication bus (e.g., shifted out onto the parallel communication bus, without limitation) so as to be received at the parallel interface of the second device during a transaction synced to a clock.

At operation 116, process 100 optionally releases serial communication interfaces of the serial interface group upon sending the symbols. The released serial communication interfaces may, upon release, be separately available for serial communication, or to be used to form the same or different serial interface groups.

Operation 102 and operation 104 may be understood to form, or form a portion of, a data preparation process. Operation 106, operation 108, operation 110, and operation 112 may be understood to form, or form a portion of, a serial interface setup process.

Figure 2:
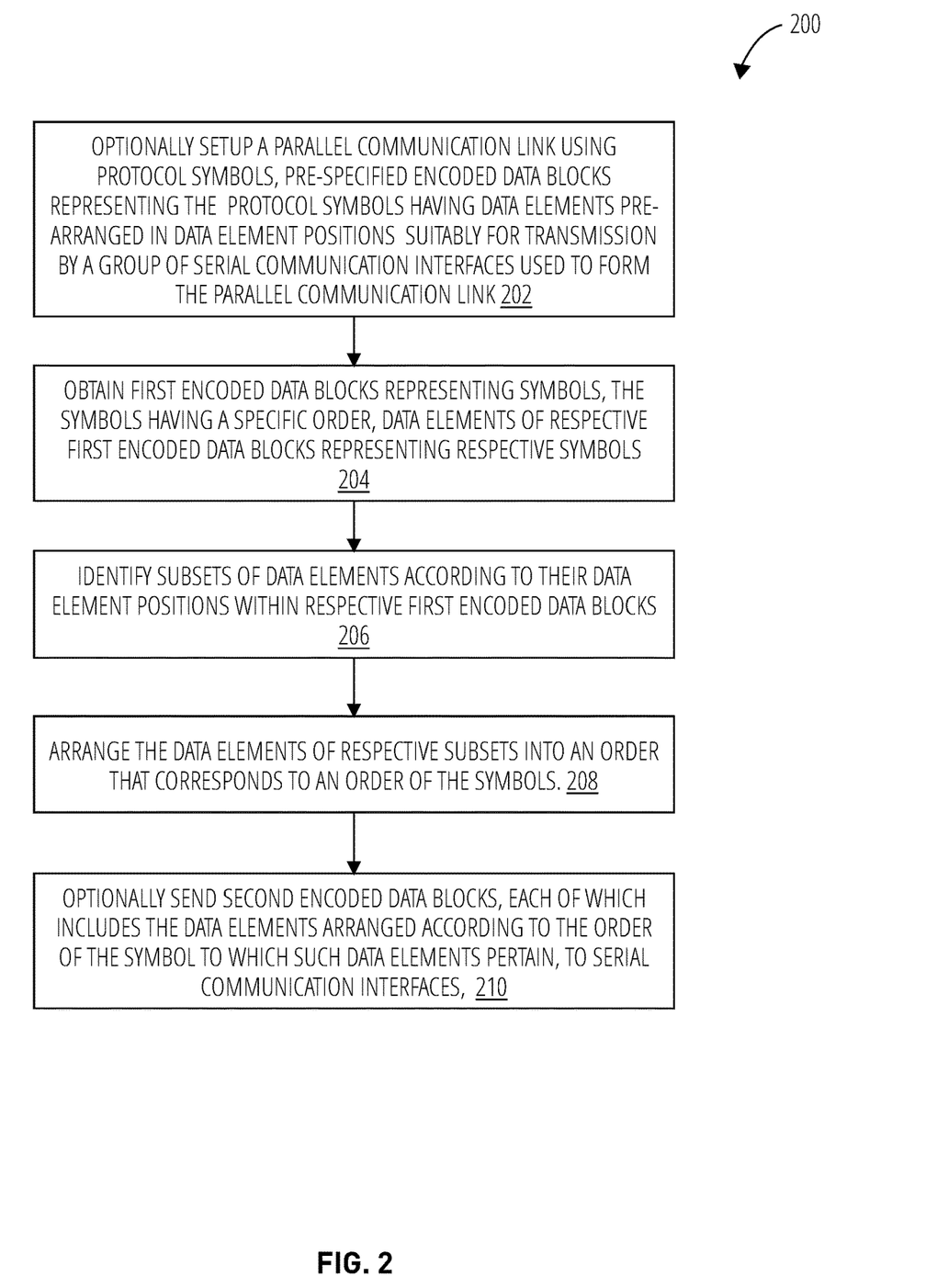
FIG. 2 is a flow chart depicting a process for arranging data elements of second encoded data blocks as part of a process for interfacing a number of serial communication interfaces of a first device with a parallel communication interface of a second device, in accordance with one or more embodiments.

FIG. 2 is a flowchart depicting a process 200 for arranging data elements of second encoded data blocks as part of a process for translating first encoded data blocks to second encoded data blocks suitable for input and sending by serial communication interfaces of a first device coupled to a parallel communication interface of a second device, in accordance with one or more embodiments.

At operation 202, process 200 optionally sets up (e.g., initializes, trains, without limitation) a parallel communication link using pre-specified protocol symbols. The pre-specified encoded data blocks representing the protocol symbols may have data elements pre-arranged in data element positions of the pre-specified encoded data blocks suitably for sending the protocol symbols using the number of serial communication interfaces.

At operation 204, process 200 obtains first encoded data blocks representing symbols. The symbols, and therefore the first encoded data blocks, may have data elements, and the symbols may be arranged in a specific order. In one non-limiting example, each data block of the first encoded data blocks represents a symbol.

At operation 206, process 200 identifies subsets of data elements according to their data element positions within respective first encoded data blocks. For example, a first identified subset may include data elements in a data element position the corresponds to a most-significant-bit (MSB) of the respective first encoded data blocks, a second identified subset may include data elements in a data element position that corresponds to an adjacent position to the MSB of the first encoded data blocks, and so on.

At operation 208, process 200 arranges the data elements of respective subsets into an order that corresponds to an order of the symbols. For example, the data elements at the most significant data element positions of a subset correspond to a first symbol, the data elements of the next data element position of a subset correspond to a next symbol, and so on. Second encoded data blocks may be obtained in response to performing operation 206.

At operation 210, process 200 optionally sends second encoded data blocks, each of which includes the data elements arranged according the order of the symbol to which they pertain, to serial communication interfaces, at described above in relation to operation 110.

Figure 3:
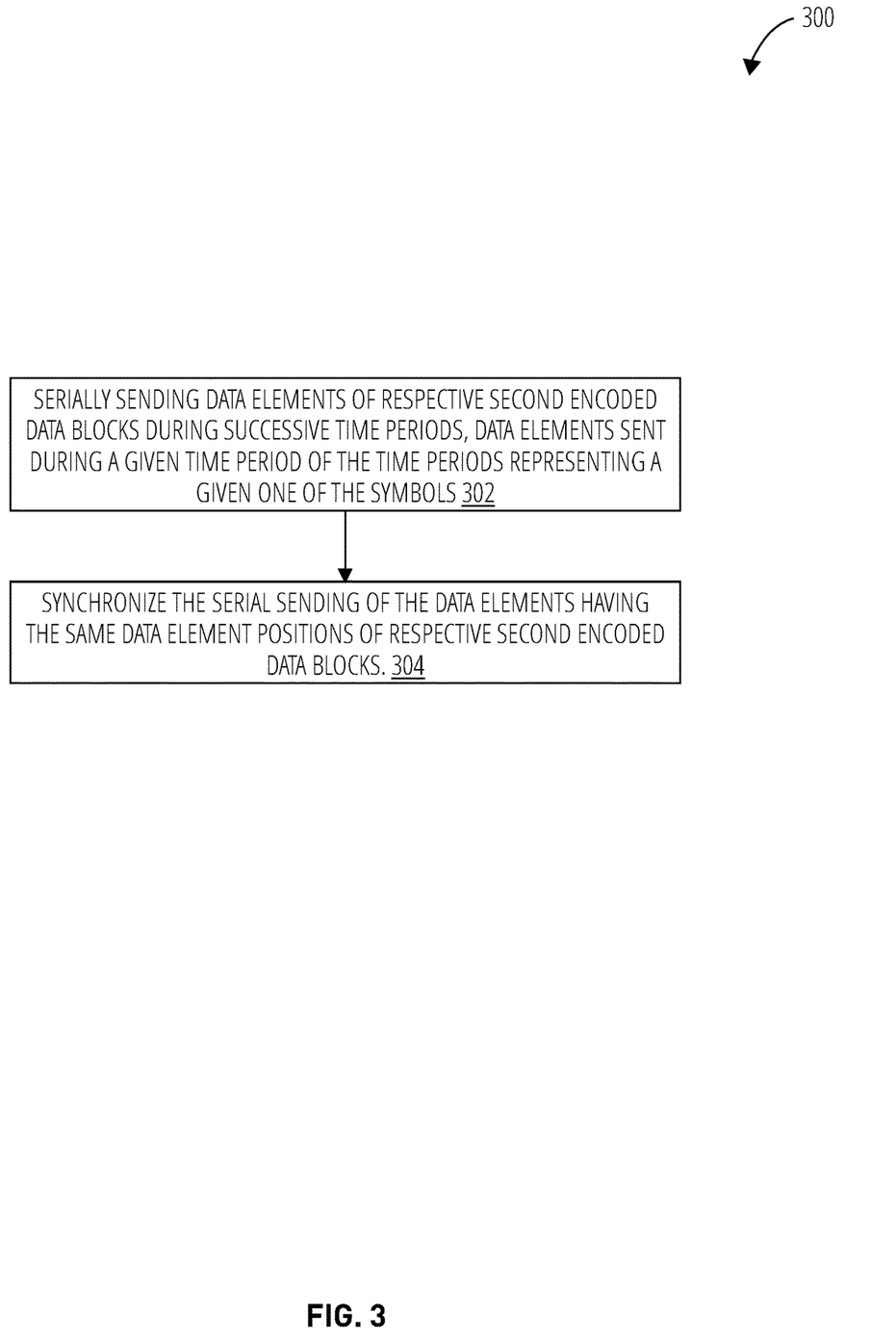
FIG. 3 is a flow chart depicting a process for providing, by a first device, second encoded data blocks (e.g., arranged via process 200, without limitation) to a parallel communication interface of a second device in accordance with one or more embodiments.

FIG. 3 is a flowchart depicting a process 300 for providing, by a first device, second encoded data blocks (e.g., arranged via process 200, without limitation) to a parallel communication interface of a second device, in accordance with one or more embodiments.

At operation 302, process 300 serially sends data elements of respective second encoded data blocks during successive time periods. The data elements sent (e.g., clocked out together, without limitation) during a given one of the time periods represent a given one of the symbols.

At operation 304, process 300 synchronizes the serial sending of the data elements having the same data element positions of respective second encoded data blocks.

Figure 4:
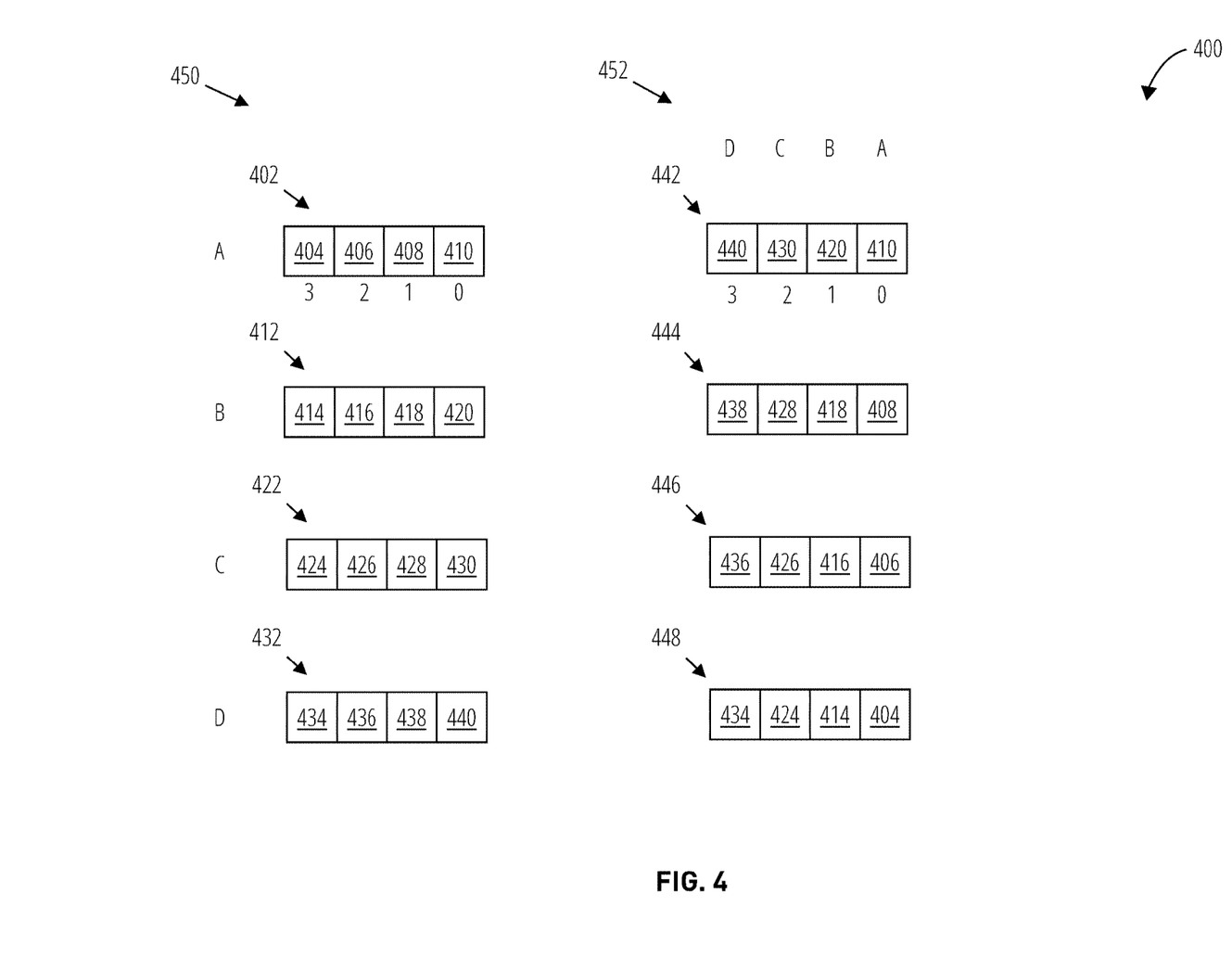
FIG. 4 is a flow chart depicting a process for data preparation by a first device preparing to send symbols to a second device, in accordance with one or more embodiments.

FIG. 4 is a diagram depicting a process 400 for data preparation by a first device preparing to send symbols to a second device, in accordance with one or more embodiments. Process 400 depicts a non-limiting example of preparing data in accordance with process 100 and process 200 to translate symbols of first encoded data blocks 450 into a format suitable for input to multiple serial communication interfaces, i.e., into symbols of a second encoded data blocks 452.

In the specific example depicted by FIG. 4, process 400 obtains symbols represented by first encoded data blocks 450, each having a number N data elements arranged in a first order to represent a given symbol. First encoded data blocks 450 include the four symbols denoted as 'A' 'B' 'C' and 'D' in FIG. 4. First encoded data block 402 represents symbol A, first encoded data block 412 represents symbol B, first encoded data block 422 represents symbol C, and first encoded data block 432 represents symbol D. Each encoded data block (e.g., of first encoded data blocks 450 or second encoded data blocks 452, without limitation) includes a number of encoded data elements (which may sometimes be referred to herein as "data elements"). The grouping of these data elements in a specific arrangement forms the encoded data blocks that represents a symbol.

In the specific example depicted by FIG. 4, first encoded data block 402 includes data elements 404, 406, 408 and 410; first encoded data block 412 includes data elements 414, 416, 418, and 420; first encoded data block 422 includes data elements 424, 426, 428, and 430; and first encoded data block 432 includes data elements 434, 436, 438, and 440. Data elements are associated with data element positions within respective encoded data block (e.g., of first encoded data blocks 450 or second encoded data blocks 452, without limitation). In various embodiments, any suitable convention may be used for identifying data element positions. Using first encoded data block 402 as an example that applies to all of the first encoded data blocks of process 400, data element 410 is associated with data element position 0, data element 408 is associated with data element position 1, data element 406 is associated with data element position 2, and data element 404 is associated with data element position 3. Using the example of an arbitrary number of bits of digital information, data element position 0 is the most significant bit (MSB) and data element position 3 is the least significant bit (LSB). Other conventions for identifying data element positions may be used without exceeding the scope of this disclosure.

For ease of illustration, four data elements are depicted for each encoded data block. In embodiments where a data element is a binary digit (i.e., a bit of digital information), by convention, a byte of digital information is represented using eight encoded bits, and a nibble of digital information is represented using fewer than eight encoded bits.

As discussed above, process 400 prepares the first encoded data blocks 450 for sending by forming second encoded data blocks 452 from first encoded data blocks 450. Process 400 rearranges the data elements of the first encoded data blocks 450 so that for resultant second encoded data blocks 452, the data elements within a same data element position of a respective second encoded data blocks 452 represent a given one of the symbols A, B, C or D. More specifically, process 400 forms second encoded data block 442, second encoded data block 444, second encoded data block 446 and second encoded data block 448 from respective subsets of data elements of first encoded data block 402, first encoded data block 412, first encoded data block 422 and first encoded data block 432. Second encoded data block 442, includes data elements 410, 420, 430 and 440; second encoded data block 444 includes data elements 408, 418, 428 and 438; second encoded data block 446 includes data elements 406, 416, 426, and 436; and second encoded data block 448 includes data elements 404, 414, 424, and 434. Notably, data elements of respective first encoded data blocks 402, 412, 422, and 432 are distributed among second encoded data blocks 446, 448, 444, and 442. In some embodiments, data elements may be distributed according to an associated data element position within an encoded data block of first encoded data blocks 450. In the specific example depicted by FIG. 4, data elements of first encoded data block 402 are at data element position 0 of the various second encoded data blocks 452, data elements of first encoded data block 412 are at data element position 1 of the various second encoded data blocks 452, data elements of first encoded data block 422 are at data element position 2 of the second encoded data blocks 452, and data elements of first encoded data block 432 are at data element position 3 of the various second encoded data blocks 452.

A number N of SCIs may be logically grouped for coupling to a parallel communication interface of the another (second) device. At least while grouped, each of the number N of SCIs may share a clock. Respective second encoded data blocks 452 may be sent to different ones of the number of N of SCIs. Such logically grouped SCIs are coupled to the parallel communication interface of the other device for example, by coupling to transmission lines. The data elements of second encoded data blocks 452 are clocked-out to the transmission lines and thus the parallel communication interface of the other device responsive to the shared clock. By way of a non-limiting example of a contemplated communication, data elements in data element position 0 of second encoded data blocks 452 are provided to a parallel communication interface of a another device during a first communication transaction, data elements in data element position 1 of second encoded data blocks 452 are provided to the parallel communication interface of the other device in a subsequent communication transaction, and so on until all of the data elements have been provided to the parallel communication interface of the other device.

In various embodiments, the number of data blocks used to form second encoded data blocks 452 may be based, at least in part, on a number of available serial communication interfaces, a size (i.e., number of bits that may be simultaneously sent) of a parallel communication interface, and combinations thereof. In the specific example depicted by FIG. 4, four data blocks are formed because four serial communication interfaces (not shown) are available or because the parallel communication interface of the second device is 4 bits wide. This description specifically contemplates embodiments where fewer than all of the data elements of a symbol may be sent with each communication transaction. In such embodiments, data elements of a symbol may sent over two or more communication transactions, and arranged in encoded data blocks of second encoded data blocks to facilitate sending over two or more communication transactions.

In various embodiments, respective encoded data elements may be capable of having any of a number of measurable states that have recognized informational value. As a non-limiting example, respective data elements may be binary digits that may be set to a value (e.g., a voltage level, without limitation) corresponding to a '0' and a value corresponding to a '1' (i.e., a state of a '1' or a state of a '0'). It should be appreciated that this description is not limited to embodiments using binary digits, and this description specifically contemplated that in some embodiments, respective data elements may be set to a state that is a coherent superposition of a binary digit (e.g., a quantum bit or "qbit," without limitation).

The above has been described in relation to data transmission transaction using grouped serial communication interfaces of a first device. Notably, during a data reception transaction of the first device, symbols are received (i.e., received symbols) from the second device distributed across a group of serial communication interfaces of the first device. Data elements of the received encoded data blocks may be arranged in new encoded data blocks processed according to the logical reverse of what is depicted by FIG. 4. In other words, all the data elements corresponding to data element position 0 of the received encoded data blocks are arranged into a first new encoded data block that represents a received symbol, all of the data elements corresponding to data element position 1 of the received encoded data blocks are serially arranged (e.g., serialized, without limitation) into a second new encoded data block that represents another symbol, and so on.

Figure 5:
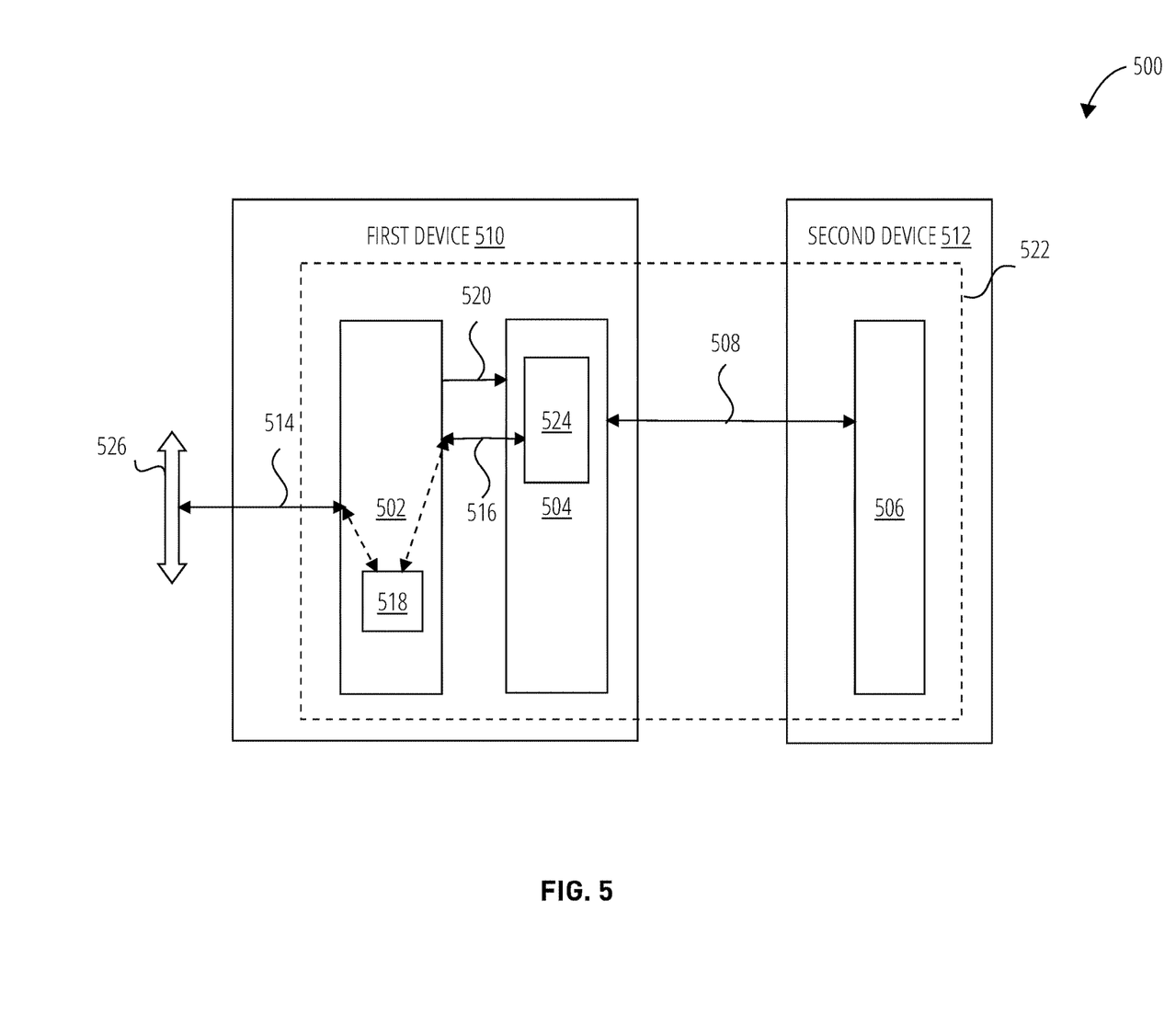
FIG. 5 is a block diagram depicting a system that includes a parallel communication link defined between a first device and a second device, where a number of serial communication interfaces, specifically grouped serial communication interfaces, provided at the first device are coupled to a parallel communication interface of second device, in accordance with one or more embodiments.

FIG. 5 is a block diagram depicting a system 500 that includes a parallel communication link 522 defined between a first device 510 and a second device 512, in accordance with one or more embodiments. Parallel communication link 522 includes a PCI 502 and grouped SCIs 524 of SCIs 504 provided at the first device 510, which are logically coupled to a PCI 506 of second device 512 and physically coupled to PCI 506 of second device 512 by transmission line 508.

PCI 502 is configured, generally, to receive first encoded data blocks 514 (representing a number of symbols) and provide the data elements of the first encoded data blocks 514 as second encoded data blocks 516, the data elements arranged suitably for receipt and transmission by grouped SCIs 524 in a manner that maintains the order of the symbols. Interfacing logic 518 of PCI 502 is configured, generally, to select and synchronize two or more SCIs 504 to form grouped SCIs 524, and perform data preparation operations of process 100 of FIG. 1, and optionally of process 200 of FIG. 2 or process 300 of FIG. 3 and as generally depicted by process 400 of FIG. 4. Upon selecting and synchronizing a number of SCIs 504 to form grouped SCIs 524, interfacing logic 518 may be configured to arrange the data elements of first encoded data blocks 514 into second encoded data blocks 516 as discussed herein and provide second encoded data blocks 516 to respective SCIs of grouped SCIs 524. Interfacing logic 518 may clock the grouped SCIs 524 synchronously via shared clock 520 such that second encoded data blocks 516 are clocked out to a transmission lines 508 and provided to PCI 506 of second device 512. In one embodiment, the symbols, one symbol at a time, as represented by the second encoded data blocks, are thus transmitted synchronously in parallel.

In one or more embodiments, interfacing logic 518 or protocol control logic (not shown) of PCI 502 may be configured to initialize and train parameters for parallel communication link 522 according to a parallel communication protocol implemented by first device 510 and second device 512. First encoded data blocks 514 may be protocol-specific symbols for initializing a stable parallel communication link between link partners. In one or more embodiments, PCI 502 may be configured as an interfacing layer between a parallel communication protocol and SCIs 504 that receives such protocol-specific symbols for initializing the link from the protocol layer. In one or more embodiments, PCI 502 may be a sub-layer or otherwise may be a part of an interface for a parallel communication protocol and may store pre-specified symbols for initialization, training, and/or re-training of parallel communication link 522, and which are arranged as seconded encoded data blocks (e.g., second encoded data blocks 452, without limitation) suitable for transmission by grouped SCIs 524. In some embodiments, PCI 502 may store pre-specified symbols represented by second encoded data blocks respectively configured (e.g., respectively having a pre-specified number of data element positions, without limitation) to accommodate a number of different bit widths that may be used in a potential parallel communication link.

Notably, some SCIs of SCIs 504 may not be selected for grouped SCIs 524. Such SCIs may be available for serial communication or for forming different parallel communication links than parallel communication link 522.

In one or more embodiments, interfacing logic 518 may be configured to select grouped SCIs 524 for a data reception, and prepare received data to be provided to a parallel bus 526 coupled to PCI 502. In a case of a data reception, shared clock 520 may be clocked by interfacing logic 518 to synchronize transmission of data elements from grouped SCIs 524 to PCI 502. In various embodiments, grouped SCIs 524 may be selected for transmission transactions, reception transactions, or both transmission and reception transactions with PCI 506.

Figure 6:
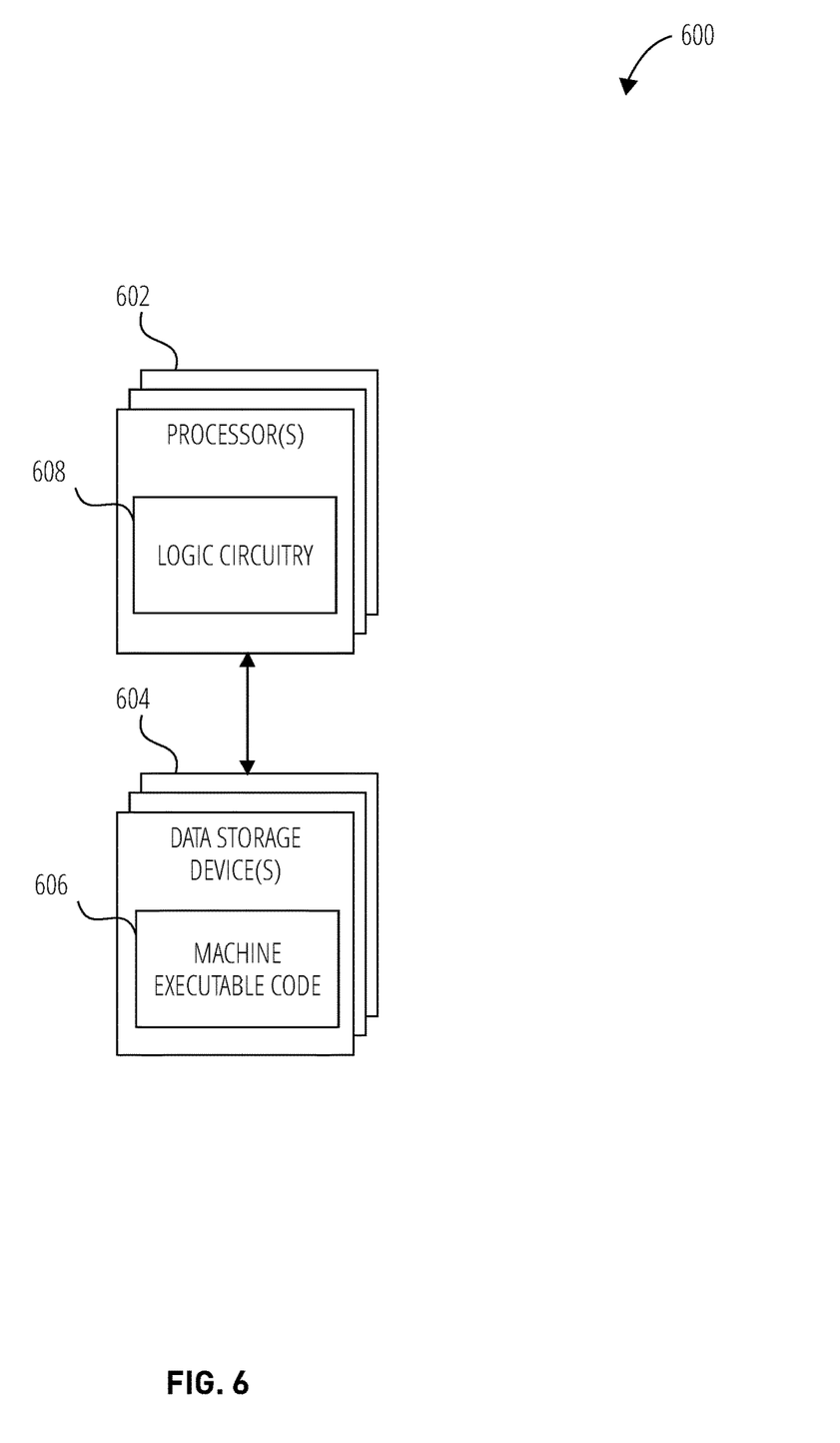
FIG. 6 is a block diagram depicting a circuitry that may be used to implement various functions, operations, acts, processes, and/or methods, in accordance with one or more embodiments.

FIG. 6 is a block diagram of circuitry 600 that, in some embodiments, may be used to implement various functions, operations, acts, processes, and/or methods disclosed herein. The circuitry 600 includes one or more processors 602 (sometimes referred to herein as "processors 602") operably coupled to one or more data storage devices 604 (sometimes referred to herein as "storage 604"). The storage 604 includes machine executable code 606 stored thereon and the processors 602 include logic circuitry 608. The machine executable code 606 include information describing functional elements that may be implemented by (e.g., performed by) the logic circuitry 608.

The logic circuitry 608 is adapted to implement (e.g., perform) the functional elements described by the machine executable code 606. The circuitry 600, when executing the functional elements described by the machine executable code 606, should be considered as special purpose hardware configured for carrying out functional elements disclosed herein. In some embodiments the processors 602 may be configured to perform the functional elements described by the machine executable code 606 sequentially, concurrently (e.g., on one or more different hardware platforms), or in one or more parallel process streams.

When implemented by logic circuitry 608 of the processors 602, the machine executable code 606 is configured to adapt the processors 602 to perform operations of embodiments disclosed herein. For example, the machine executable code 606 may be configured to adapt the processors 602 to perform at least a portion or a totality of the process 200 of FIG. 2, the process 300 of FIG. 3, and the process 400 of FIG. 4. As another example, the machine executable code 606 may be configured to adapt the processors 602 to perform at least a portion or a totality of the operations discussed for interfacing a number of serial communication interfaces with a parallel communication interface described herein.

The processors 602 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute computing instructions (e.g., software code) related to embodiments of the present disclosure.

It is noted that a general-purpose processor may be a microprocessor, but in the alternative, the processors 602 may include any conventional processor, controller, microcontroller, or state machine. The processors 602 may also be implemented as a combination of computing devices, such as a combination of a DSP and a microprocessor, a plurality of microprocessors, one or more microprocessors in conjunction with a DSP core, or any other such configuration.

In some embodiments the storage 604 includes volatile data storage (e.g., random-access memory (RAM)), non-volatile data storage (e.g., Flash memory, a hard disc drive, a solid state drive, erasable programmable read-only memory (EPROM), etc.). In some embodiments the processors 602 and the storage 604 may be implemented into a single device (e.g., a semiconductor device product, a system on chip (SOC), etc.). In some embodiments the processors 602 and the storage 604 may be implemented into separate devices.

In some embodiments the machine executable code 606 may include computer-readable instructions (e.g., software code, firmware code). By way of non-limiting example, the computer-readable instructions may be stored by the storage 604, accessed directly by the processors 602, and executed by the processors 602 using at least the logic circuitry 608. Also by way of non-limiting example, the computer-readable instructions may be stored on the storage 604, transferred to a memory device (not shown) for execution, and executed by the processors 602 using at least the logic circuitry 608. Accordingly, in some embodiments the logic circuitry 608 includes electrically configurable logic circuitry 608.

In some embodiments the machine executable code 606 may describe hardware (e.g., circuitry) to be implemented in the logic circuitry 608 to perform the functional elements. This hardware may be described at any of a variety of levels of abstraction, from low-level transistor layouts to high-level description languages. At a high-level of abstraction, a hardware description language (HDL) such as a hardware description language (HDL) adopted by the Institute Of Electrical and Electronics Engineers (IEEE) may be used, without limitation. By way of non-limiting examples, VERILOG™, SYSTEMVERILOG™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 608 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some embodiments the machine executable code 606 may include an HDL, an RTL, a GL description, a mask level description, other hardware description, or any combination thereof.

In embodiments where the machine executable code 606 includes a hardware description (at any level of abstraction), a system (not shown, but including the storage 604) may be configured to implement the hardware description described by the machine executable code 606. By way of non-limiting example, the processors 602 may include a programmable logic device (e.g., an FPGA or a PLC) and the logic circuitry

608 may be electrically controlled to implement circuitry corresponding to the hardware description into the logic circuitry 608. Also by way of non-limiting example, the logic circuitry 608 may include hard-wired logic manufactured by a manufacturing system (not shown, but including the storage 604) according to the hardware description of the machine executable code 606.

Regardless of whether the machine executable code 606 includes computer-readable instructions or a hardware description, the logic circuitry 608 is adapted to perform the functional elements described by the machine executable code 606 when implementing the functional elements of the machine executable code 606. It is noted that although a hardware description may not directly describe functional elements, a hardware description indirectly describes functional elements that the hardware elements described by the hardware description are capable of performing.

Some typical parallel communication buses do not include separate sets of lines for sending and for receiving (as a non-limiting example, it would require more I/O pins than an MCU designer might want to dedicate). Accordingly, a data transmission (i.e., a communication) in accordance with one or more embodiments may begin by a first device (i.e., a transmitter) sending a data transmission request (i.e., "I have data to send, tell me when you are ready to receive it") to a second device (i.e., a receiver), a second device sending a data reception request ("I want data, do you have any?") to the first device, or a master device that commands a slave device to send data ("I want data, send me your data"). In the first scenario, the first device sends the data in response to the second device indicating that it is ready to receive data. In the second scenario, the second device informs the first device that it wants data, sets itself up to receive a symbol of data, and then asks the first device if it has any data to send the second device. In the third scenario, the master device sets itself up to receive data and then commands the slave device to send the slave's data to it (to the master device).

In some communication systems known to the inventor of this disclosure a receiver asks for data using a connection to a specific external pin of the transmitter. Continuously asking for data using the pin may monopolize CPU time of the transmitter, the receiver, or both. To avoid monopolizing CPU time and to provide a streamlined operation more generally, in some embodiments a clock may be coupled to a toggle pin, which is instructed to toggle using a core-independent peripheral. That is, a peripheral that is not supervised by a processing core or a central processing unit of a computing device such as a microcontroller, embedded system, or microelectronic device, without limitation.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting embodiments of the disclosure include:

Embodiment 1: A method of interfacing a number of serial communication interfaces of a first device with a parallel communication interface of a second device, comprising: obtaining symbols represented by first encoded data blocks having data elements arranged in a first order; forming second encoded data blocks by arranging the data elements such that data elements within a same data element position of respective second encoded data blocks represent a given one of the symbols; providing the second encoded data blocks to a number of serial communication interfaces coupled to a parallel communication interface of another device; and sending the symbols, one symbol at a time, as represented by the second encoded data blocks.

Embodiment 2: The method according to Embodiment 1, wherein sending the symbols comprises serially sending the second encoded data blocks.

Embodiment 3: The method according to any of Embodiments 1 and 2, wherein sending the symbols comprises: sending the data elements within a same data element position of the respective second encoded data blocks at substantially a same time.

Embodiment 4: The method according to any of Embodiments 1 through 3, further comprising: sending the data elements within the second encoded data blocks according to an order of the symbol to which respective data elements pertain.

Embodiment 5: The method according to any of Embodiments 1 through 4, further comprising selecting a grouped serial communication interfaces comprising the number of serial communication interfaces.

Embodiment 6: The method according to any of Embodiments 1 through 5, further comprising synchronizing the serial communication interfaces of the grouped serial communication interfaces.

Embodiment 7: The method according to any of Embodiments 1 through 6, further comprising coupling respective outputs of the grouped serial communication interfaces to individual inputs of the parallel communication interface of the second device.

Embodiment 8: The method according to any of Embodiments 1 through 7, further comprising: receiving, from grouped serial communication interfaces, received encoded data blocks representing received symbols; arranging data elements of the received encoded data blocks into new encoded data blocks that respectively represent one of the received symbols; and providing the new encoded data block to a parallel communication bus.

Embodiment 9: The method according to any of Embodiments 1 through 8, further comprising: setting up a parallel communication link using protocol symbols represented by pre-specified encoded data blocks having data elements pre-arranged in data element positions of the pre-specified encoded data blocks suitably for sending the protocol symbols using the number of serial communication interfaces.

Embodiment 10: A computing device, comprising: a number of serial communication interfaces; and an interfacing logic configured to: obtain symbols represented by first encoded data blocks having data elements arranged in a first order; form second encoded data blocks by arranging the data elements of the first encoded data blocks such that data elements within a same data element position of respective second encoded data blocks represent a given one of the symbols; provide the second encoded data blocks to the number of serial communication interfaces grouped for coupling to a parallel communication interface of another device; and send the symbols, one symbol at a time, as represented by the second encoded data blocks.

Embodiment 11: The computing device according to Embodiment 10, wherein the interfacing logic is configured to select the number of serial communication interfaces.

Embodiment 12: The computing device according to any of Embodiments 10 and 11, wherein the interfacing logic is provided at a parallel communication interface of the computing device.

Embodiment 13: The computing device according to any of Embodiments 10 through 12, wherein the interfacing logic is configured to provide a shared clock for synchronizing the sending of the symbols.

Embodiment 14: The computing device according to any of Embodiments 10 through 13, wherein the interfacing logic is configured to arrange data elements of received second encoded data blocks representing received symbols into new first encoded data blocks representing the received symbols, the received symbols received from the number of serial communication interfaces grouped for coupling to the parallel communication interface.

Embodiment 15: The computing device according to any of Embodiments 10 through 14, wherein the data elements of the second encoded data blocks are arranged according to the order of the symbol to which respective data elements of the second encoded data blocks pertain.

Embodiment 16: The computing device according to any of Embodiments 10 through 15, further comprising protocol symbols represented by pre-specified encoded data blocks having data elements pre-arranged in data element positions of the pre-specified encoded data blocks suitably for sending the protocol symbols using the number of serial communication interfaces.

Embodiment 17: A system comprising: a first and a second devices; and an interfacing logic configured to arrange data elements of first encoded data blocks, each of the first encoded data blocks representing a symbol, into second encoded data blocks such that data elements within a same data element position of respective second encoded data blocks represent a given one of the symbols, and provide the second encoded data blocks to a first group of serial communication interfaces of the first device coupled to a parallel communication interface of the second device.

Embodiment 18: The system according to Embodiment 17, wherein the interfacing logic is configured to receive, from a second group of serial communication interfaces, received encoded data blocks representing received symbols and arrange data elements of the received encoded data blocks into new encoded data blocks representing the received symbols.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A method of interfacing at least two serial communication interfaces of a first device with a parallel communication interface of a second device, comprising:
    obtaining symbols represented by first encoded data blocks having data elements arranged in a first order;
    forming second encoded data blocks by arranging the data elements such that data elements within a same data element position of respective second encoded data blocks represent a given one of the symbols;
    providing the second encoded data blocks to at least two serial communication interfaces coupled to a parallel communication interface of another device; and
    sending the symbols, one symbol at a time, as represented by the second encoded data blocks.

2. The method of claim 1, wherein sending the symbols comprises serially sending the second encoded data blocks.

3. The method of claim 1, wherein sending the symbols comprises:
    sending the data elements within a same data element position of the respective second encoded data blocks at substantially a same time.

4. The method of claim 1, further comprising:
    sending the data elements within the second encoded data blocks according to an order of the symbol to which respective data elements pertain.

5. The method of claim 1, further comprising selecting a grouped serial communication interfaces comprising the at least two serial communication interfaces.

6. The method of claim 5, further comprising synchronizing the serial communication interfaces of the grouped serial communication interfaces.

7. The method of claim 5, further comprising coupling respective outputs of the grouped serial communication interfaces to individual inputs of the parallel communication interface of the second device.

8. The method of claim 1, further comprising:
    receiving, from grouped serial communication interfaces, received encoded data blocks representing received symbols;
    arranging data elements of the received encoded data blocks into new encoded data blocks that respectively represent one of the received symbols; and
    providing the new encoded data block to a parallel communication bus.

9. The method of claim 1, further comprising:
setting up a parallel communication link using protocol symbols represented by pre-specified encoded data blocks having data elements pre-arranged in data element positions of the pre-specified encoded data blocks suitably for sending the protocol symbols using the at least two serial communication interfaces.

10. A computing device, comprising:
at least two serial communication interfaces; and
an interfacing logic to:
obtain symbols represented by first encoded data blocks having data elements arranged in a first order;
form second encoded data blocks by arranging the data elements of the first encoded data blocks such that data elements within a same data element position of respective second encoded data blocks represent a given one of the symbols;
provide the second encoded data blocks to at least two serial communication interfaces grouped for coupling to a parallel communication interface of another device; and
send the symbols, one symbol at a time, as represented by the second encoded data blocks.

11. The computing device of claim 10, wherein the interfacing logic to select at least two serial communication interfaces.

12. The computing device of claim 10, wherein the interfacing logic is provided at a parallel communication interface of the computing device.

13. The computing device of claim 10, wherein the interfacing logic to provide a shared clock for synchronizing the sending of the symbols.

14. The computing device of claim 10, wherein the interfacing logic to arrange data elements of received second encoded data blocks representing received symbols into new first encoded data blocks representing the received symbols, the received symbols received from the at least two serial communication interfaces grouped for coupling to the parallel communication interface.

15. The computing device of claim 10, wherein the data elements of the second encoded data blocks are arranged according to the order of the symbol to which respective data elements of the second encoded data blocks pertain.

16. The computing device of claim 10, further comprising protocol symbols represented by pre-specified encoded data blocks having data elements pre-arranged in data element positions of the pre-specified encoded data blocks suitably for sending the protocol symbols using the at least two serial communication interfaces.

17. A system comprising:
a first and a second devices; and
an interfacing logic to arrange data elements of first encoded data blocks, each of the first encoded data blocks representing a symbol, into second encoded data blocks such that data elements within a same data element position of respective second encoded data blocks represent a given one of the symbols, and provide the second encoded data blocks to a first group of serial communication interfaces of the first device coupled to a parallel communication interface of the second device.

18. The system of claim 17, wherein the interfacing logic to receive, from a second group of serial communication interfaces, received encoded data blocks representing received symbols and arranged data elements of the received encoded data blocks into new encoded data blocks representing the received symbols.

* * * * *

UNITED STATES PATENT AND TRADEMARK OFFICE
CERTIFICATE OF CORRECTION

| | | |
|---|---|---|
| PATENT NO. | : 11,397,702 B2 | |
| APPLICATION NO. | : 17/171697 | |
| DATED | : July 26, 2022 | |
| INVENTOR(S) | : Johan Vaarlid | |

It is certified that error appears in the above-identified patent and that said Letters Patent is hereby corrected as shown below:

In the Drawings

Please replace Figs. 1-3 with Figs. 1-3 as shown on the attached pages.

Signed and Sealed this
Sixth Day of June, 2023

Katherine Kelly Vidal
*Director of the United States Patent and Trademark Office*